United States Patent
Nakayama et al.

(10) Patent No.: US 6,621,172 B2
(45) Date of Patent: Sep. 16, 2003

(54) SEMICONDUCTOR DEVICE AND METHOD OF FABRICATING THE SAME, CIRCUIT BOARD, AND ELECTRONIC EQUIPMENT

(75) Inventors: Hirohisa Nakayama, Sakata (JP); Jun Taniguchi, Sakata (JP); Takashi Abe, Sakata (JP); Toshinori Nakayama, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/842,825

(22) Filed: Apr. 27, 2001

(65) Prior Publication Data

US 2002/0004258 A1 Jan. 10, 2002

Related U.S. Application Data

(63) Continuation of application No. PCT/JP00/05954, filed on Sep. 1, 2000.

(30) Foreign Application Priority Data

Sep. 3, 1999 (JP) .............................. 11-249702

(51) Int. Cl.⁷ .................... H01L 23/28; H01L 23/02; H01L 21/44
(52) U.S. Cl. .................... 257/787; 257/686; 257/777; 438/127
(58) Field of Search ................ 257/686, 685, 257/700, 678, 723, 777, 778, 787; 438/106, 108, 109, 118, 124, 126, 127

(56) References Cited

U.S. PATENT DOCUMENTS

| | | | | |
|---|---|---|---|---|
| 5,641,996 A | * | 6/1997 | Omoya et al. | 257/787 |
| 6,100,594 A | * | 8/2000 | Fukui et al. | 257/777 |
| 6,133,637 A | * | 10/2000 | Hikita et al. | 257/777 |
| 6,215,182 B1 | * | 4/2001 | Ozawa et al. | 257/723 |
| 6,340,846 B1 | * | 1/2002 | LoBianco et al. | 257/783 |
| 6,353,263 B1 | * | 3/2002 | Dotta et al. | 257/777 |

FOREIGN PATENT DOCUMENTS

| | | | |
|---|---|---|---|
| EP | A1 0 915 505 | | 5/1999 |
| JP | A 5-47998 | | 2/1993 |
| JP | A 6-177323 | | 6/1994 |
| JP | A 9-260441 | | 10/1997 |
| JP | A 11-204720 | | 7/1999 |
| JP | A 11-219984 | * | 8/1999 |
| TW | 85114766 | | 8/1999 |

* cited by examiner

Primary Examiner—Kamand Cuneo
Assistant Examiner—Scott B. Geyer
(74) Attorney, Agent, or Firm—Oliff & Berridge, PLC

(57) ABSTRACT

A first semiconductor chip is mounted on a substrate on which an interconnect pattern is formed, and a surface of the first semiconductor chip having electrodes faces the substrate. A second semiconductor chip is mounted on the first semiconductor chip. Electrodes of the second semiconductor chip are electrically connected to the interconnect pattern by wires. A first resin is provided between the first semiconductor chip and the substrate, and a second resin which differs from the first resin seals the first and second semiconductor chips.

24 Claims, 5 Drawing Sheets

SEMICONDUCTOR DEVICE AND METHOD OF FABRICATING THE SAME, CIRCUIT BOARD, AND ELECTRONIC EQUIPMENT

Japanese patent application No.11-249702, filed Sep. 3, 1999 is hereby incorporated by reference in its entirety. International application con. of No. PCT/JP00/05954, filed Sep. 1, 2000, is hereby incorporated by reference in its entirety.

BACKGROUND OF THE INVENTION

1. Field of the Invention

The present invention relates to a semiconductor device and a method of fabricating the same, a circuit board, and electronic equipment.

2. Description of Related Art

Accompanied by miniaturization of electronic equipment, multichip modules including a plurality of semiconductor chips at high density have been developed. A stacked-CSP (Chip Scale/Size Package) in which multiple semiconductor chips are stacked in a single package is known as one type of multichip module.

For example, Japanese Patent Application Laid-open No. 9-260441 discloses a single packaged semiconductor device including a first semiconductor chip and a second semiconductor chip of a larger size than the first semiconductor chip which is mounted on the first semiconductor chip. According to this semiconductor device, since the first semiconductor chip located on the lower side is unstable, it may be difficult to wire bond the semiconductor chip located on the upper side.

SUMMARY OF THE INVENTION

A semiconductor device according to one aspect of the present invention comprises:
- a first semiconductor chip which has a surface having a plurality of electrodes and is mounted on a substrate having an interconnect pattern, wherein the surface having the electrodes faces the substrate and the electrodes are electrically connected to the interconnect pattern;
- a second semiconductor chip which has a surface having a plurality of electrodes and is mounted on the first semiconductor chip, wherein the surface of the second semiconductor chip having the electrodes opposes the first semiconductor chip and the electrodes of the second semiconductor chip are electrically connected to the interconnect pattern through wires;
- a first resin provided between the substrate and the first semiconductor chip; and
- a second resin, differing from the first resin, which seals the first and second semiconductor chips to the substrate.

According to this semiconductor device, the first resin provided between the first semiconductor chip and the substrate has properties differing from the second resin which seals the first and second semiconductor chips. This enables the first resin and the second resin to be selected so as to have properties suitable for each member to which the first resin and the second resin adhere. Therefore, it becomes possible to cope with ultrasonic vibration applied when wire bonding the second semiconductor chip by selecting the first resin, for example. Because of this, reliable wire bonding can be performed, whereby the semiconductor device can be obtained at high yield.

Note that the first and second semiconductor chips refer to two arbitrary semiconductor chips. The present invention is not limited to only two semiconductor chips but can be applied to more than two semiconductor chips.

A circuit board according to another aspect of the present invention is equipped with the above-described semiconductor device.

Electronic equipment according to still another aspect of the present invention comprises the above-described semiconductor device.

A method of fabricating a semiconductor device according to further aspect of the present invention comprises the steps of:
- face-down bonding a first semiconductor chip to a substrate on which an interconnect pattern is formed;
- mounting a second semiconductor chip on the first semiconductor chip;
- electrically connecting the second semiconductor chip to the interconnect pattern through wires;
- providing a first resin between the first semiconductor chip and the substrate; and
- sealing the first and second semiconductor chips with a second resin which differs from the first resin.

According to this method, the first resin provided between the first semiconductor chip and the substrate has properties differing from those of the second resin with which the first and second semiconductor chips are sealed. This enables the first resin and the second resin to be selected so as to have properties suitable for each member to which the first resin and the second resin adhere. Therefore, it becomes possible to cope with ultrasonic vibration applied when wire bonding the second semiconductor chip by selecting the first resin, for example. Because of this, reliable wire bonding can be performed, whereby the semiconductor device can be fabricated at high yield.

DETAILED DESCRIPTION OF THE EMBODIMENTS

Figure 1:
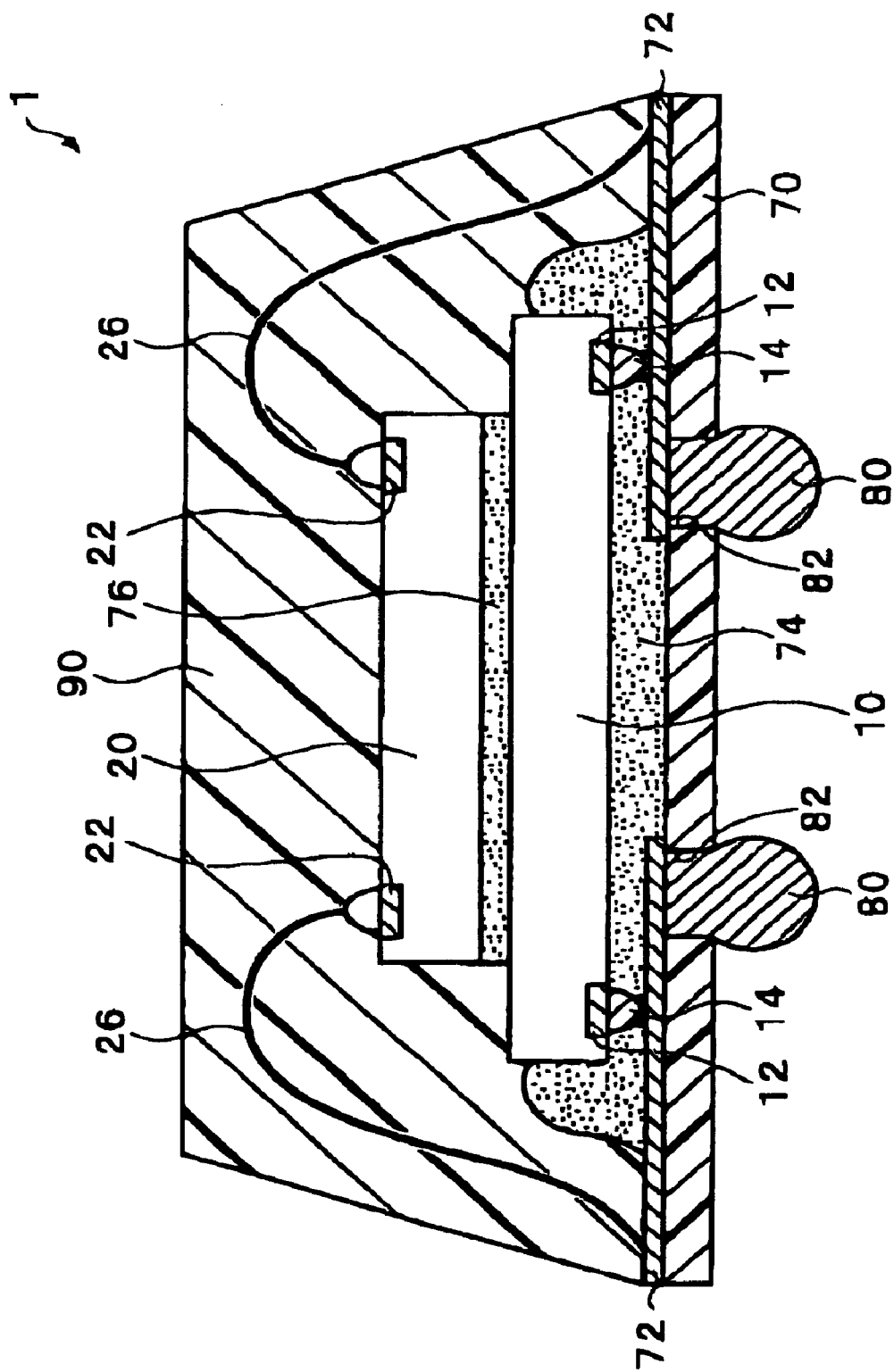
FIG. 1 is a view showing a semiconductor device according to a first embodiment of the present invention.

The embodiments have been achieved to solve this problem. An objective of the embodiments is to provide a semiconductor device and a method of fabricating the same in which multiple semiconductor chips are integrated into a single package by applying reliable wire bonding, a circuit board, and electronic equipment.

(1) A semiconductor device according to one aspect of the present invention comprises:
- a first semiconductor chip which has a surface having a plurality of electrodes and is mounted on a substrate having an interconnect pattern, wherein the surface having the electrodes faces the substrate and the electrodes are electrically connected to the interconnect pattern;

a second semiconductor chip which has a surface having a plurality of electrodes and is mounted on the first semiconductor chip, wherein the surface of the second semiconductor chip having the electrodes opposes the first semiconductor chip and the electrodes of the second semiconductor chip are electrically connected to the interconnect pattern through wires;

a first resin provided between the substrate and the first semiconductor chip; and a second resin, differing from the first resin, which seals the first and second semiconductor chips to the substrate.

According to this semiconductor device, the first resin provided between the first semiconductor chip and the substrate has properties differing from the second resin which seals the first and second semiconductor chips. This enables the first resin and the second resin to be selected so as to have properties suitable for each member to which the first resin and the second resin adhere. Therefore, it becomes possible to cope with ultrasonic vibration applied when wire bonding the second semiconductor chip by selecting the first resin, for example. Because of this, reliable wire bonding can be performed, whereby the semiconductor device can be obtained at high yield.

Note that the first and second semiconductor chips refer to two arbitrary semiconductor chips. The present invention is not limited to only two semiconductor chips but can be applied to more than two semiconductor chips.

(2) In this semiconductor device, the first resin may be an anisotropic conductive material containing conductive particles; and the electrodes of the first semiconductor chip may be electrically connected to the interconnect pattern through the conductive particles.

According to this semiconductor device, the first semiconductor chip can be fixed to the substrate and electrically connected to the interconnect pattern at the same time. Moreover, the difference in thermal stress between the first semiconductor chip and the substrate can be reduced by disposing the anisotropic conductive material between the first semiconductor chip and the substrate on which the interconnect pattern is formed. This improves reliability as a semiconductor device.

(3) In this semiconductor device, a plurality of penetrating holes may be formed in the substrate;

the interconnect pattern may be formed on one surface of the substrate, part of the interconnect pattern extending over the penetrating holes; and a plurality of external terminals may be formed on the interconnect pattern to project from a surface of the substrate opposite to the surface on which the interconnect pattern is formed through the penetrating holes.

(4) The semiconductor device may further comprise a plurality of lands for external terminals which are electrically connected to the interconnect pattern.

(5) In this semiconductor device, the substrate may be a glass epoxy substrate.

(6) In this semiconductor device, the second semiconductor chip may be bonded to the first semiconductor chip through an adhesive.

(7) In this semiconductor device, the first semiconductor chip may be larger than the second semiconductor chip.

(8) In this semiconductor device, the first resin may be provided so as to extend to the sides of the first semiconductor chip.

Since the contact area between the first resin and the first semiconductor chip is increased, the first semiconductor chip can be secured to the substrate more firmly. Therefore, it becomes possible to cope with ultrasonic vibration applied when wire bonding the second semiconductor chip, for example.

(9) In this semiconductor device, the first and second semiconductor chips may be equal in size.

(10) In this semiconductor device, the first resin may be provided so as to extend to at least the sides of the first semiconductor chip of the first and second semiconductor chips.

Since the contact area between the first resin and the first semiconductor chip is increased, the first semiconductor chip can be fixed to the substrate more firmly. The first resin may be extended to the sides of the second semiconductor chip. In this case, the second semiconductor chip can also be fixed. Therefore, it becomes possible to cope with ultrasonic vibration applied when wire bonding the second semiconductor chip, for example. Because of this, reliable wire bonding can be performed even if the first and second semiconductor chips are equal in size, whereby the semiconductor device can be obtained at high yield.

(11) In this semiconductor device, the first semiconductor chip may be smaller than the second semiconductor chip.

(12) In this semiconductor device, the first resin may be provided so as to extend to the sides of the first semiconductor chip and to a region of the second semiconductor chip which faces the substrate but avoids facing the first semiconductor chip.

According to this semiconductor device, since the contact area between the first resin and the first semiconductor chip is increased, the first semiconductor chip can be secured to the substrate more firmly. Moreover, the first resin may be extended to a region of the second semiconductor chip which faces the substrate but avoids facing the first semiconductor chip. In this case, the second semiconductor chip can also be secured. Therefore, it becomes possible to cope with ultrasonic vibration applied when wire bonding the second semiconductor chip, for example. Because of this, reliable wire bonding can be performed even if the first semiconductor chip is smaller than the second semiconductor chip, whereby the semiconductor device can be obtained at high yield.

(13) A circuit board according to another aspect of the present invention is equipped with the above-described semiconductor device.

(14) Electronic equipment according to still another aspect of the present invention comprises the above-described semiconductor device.

(15) A method of fabricating a semiconductor device according to a further aspect of the present invention comprise the steps of:

face-down bonding a first semiconductor chip to a substrate on which an interconnect pattern is formed;

mounting a second semiconductor chip on the first semiconductor chip;

electrically connecting the second semiconductor chip to the interconnect pattern through wires;

providing a first resin between the first semiconductor chip and the substrate; and sealing the first and second semiconductor chips with a second resin which differs from the first resin.

According to this method, the first resin provided between the first semiconductor chip and the substrate has properties differing from those of the second resin with which the first and second semiconductor chips are sealed. This enables the first resin and the second resin to be selected so as to have properties suitable for each member to which the first resin and the second resin adhere. Therefore, it becomes possible to cope with ultrasonic vibration applied when wire bonding the second semiconductor chip by selecting the first resin, for example. Because of this, reliable wire bonding can be performed, whereby the semiconductor device can be fabricated at high yield.

(16) In this method of fabricating a semiconductor device,
the first resin may be an anisotropic conductive material containing conductive particles; and
electrodes of the first semiconductor chip may be electrically connected to the interconnect pattern through the conductive particles.
Since the first semiconductor chip can be fixed to the substrate and electrically connected to the interconnect pattern at the same time, the number of fabrication steps can be reduced.

(17) In this method of fabricating a semiconductor device,
the second semiconductor chip may be bonded to the first semiconductor chip through an adhesive in the step of mounting the second semiconductor chip.

(18) In this method of fabricating a semiconductor device,
the first semiconductor chip may be larger than the second semiconductor chip; and
after the step of bonding the first semiconductor chip and the step of providing the first resin, at least one of the first semiconductor chip and the substrate may be pressed against the other to extend the first resin to the sides of the first semiconductor chip.
According to this method, the first resin is provided in the mounting region of the first semiconductor chip on the substrate and extended to the sides of the first semiconductor chip at the circumference thereof. This increases the contact area between the first resin and the first semiconductor chip, whereby the first semiconductor chip can be fixed to the substrate more firmly. Therefore, it becomes possible to cope with ultrasonic vibration applied when wire bonding the second semiconductor chip, for example.

(19) In this method of fabricating a semiconductor device,
the first and second semiconductor chips may be equal in size; and
after the step of bonding the first semiconductor chip and the step of providing the first resin, at least one of the first semiconductor chip and the substrate may be pressed against the other to extend the first resin to at least the sides of the first semiconductor chip among the sides of the first and second semiconductor chips.
According to this method, in addition to the mounting region of the first semiconductor chip on the substrate, the first resin is extended to the sides of the first semiconductor chip at the circumference thereof. This increases the contact area between the first resin and the first semiconductor chip, whereby the first semiconductor chip can be secured to the substrate more firmly. Moreover, the first resin may be extended to the sides of the second semiconductor chip. In this case, the second semiconductor chip can also be secured. Therefore, it becomes possible to deal with ultrasonic vibration applied when wire bonding the second semiconductor chip, for example. Because of this, wire bonding can be performed without fail even if the first and second semiconductor chips are equal in size, whereby a semiconductor device can be fabricated at high yield.

(20) In this method of fabricating a semiconductor device,
the first semiconductor chip may be smaller than the second semiconductor chip; and
after the step of bonding the first semiconductor chip and the step of providing the first resin, at least one of the first semiconductor chip and the substrate may be pressed against the other to extend the first resin to the sides of the first semiconductor chip and to a region of the second semiconductor chip which faces the substrate but avoids facing the first semiconductor chip.
According to this method, in addition to the mounting region of the first semiconductor chip on the substrate, the first resin is extended to the sides of the first semiconductor chip at the circumference thereof. This increases the contact area between the first resin and the first semiconductor chip, whereby the first semiconductor chip can be fixed to the substrate more firmly. Moreover, the first resin may be extended to a region of the second semiconductor chip which faces the substrate but avoids facing the first semiconductor chip. In this case, the second semiconductor chip can also be fixed. Therefore, it becomes possible to cope with ultrasonic vibration applied when wire bonding the second semiconductor chip, for example. Because of this, reliable wire bonding can be performed even if the first semiconductor chip is smaller than the second semiconductor chip, whereby a semiconductor device can be fabricated at high yield.

(21) In this method of fabricating a semiconductor device,
the wires may be bonded by ultrasonic waves in the step of connecting through the wires.

(22) In this method of fabricating a semiconductor device,
after bonding electrodes of the second semiconductor chip to the wires, the wires may be bonded to the interconnect pattern, in the step of connecting through the wires.
According to this method, the electrode of the second semiconductor chip can be wire-bonded without forming bumps in another step.

Embodiments of the present invention are described below with reference to the drawings.

First Embodiment

FIG. 1 is a view showing a semiconductor device according to a first embodiment of the present invention. A semiconductor device 1 includes a first semiconductor chip 10, a second semiconductor chip 20, and a substrate 70.

A plurality of electrodes 12 are formed on one surface (active surface) of the first semiconductor chip 10. In the case where the planar shape of the semiconductor chip 10 is rectangular (square or rectangle), the electrodes 12 are formed along at least one side (may be two sides facing each other or all sides). The electrodes 12 may be formed two-dimensionally in a matrix (area). Bumps may be formed by solder balls, gold wire balls, gold plating, or the like. The electrodes 12 may be formed in the shape of bumps. Nickel, chromium, titanium, or the like may be added between the electrodes 12 and the bumps as a diffusion prevention layer for the bump metal. A passivation film (not shown) such as SiN, $SiO_2$, or MgO may be formed on the first semiconductor chip 10 so as to avoid the electrodes 12. The passivation film is an electrically insulating film. Although the passivation film is not an indispensable condition of the present invention, formation of the passivation film is preferable.

The second semiconductor chip 20 may have the same structure as the first semiconductor chip 10. It is preferable that the electrodes 22 be formed along at least one side (may be two sides facing each other or all sides) in order to allow suitable formation of wires 26. In the present embodiment, the external shape of the second semiconductor chip 20 is smaller than that of the first semiconductor chip 10.

The substrate 70 may be formed using any organic or inorganic material or a composite structure of these materials. The substrate 70 may be used as an individual piece or used in the shape of a strip in which mounting regions of the semiconductor chips are formed in a matrix. In the case of using the substrate 70 in the shape of a strip, the substrate 70 is punched out in another step. As examples of the substrate 70 formed using an organic material, a flexible substrate formed of a polyimide resin and the like can be given. A tape used in TAB technology may be used as the flexible substrate. As examples of the substrate 70 formed using an inorganic material, a ceramic substrate, a glass substrate, and the like can be given. As examples of the composite structure consisting of organic and inorganic materials, a glass epoxy substrate and the like can be given. There are no specific limitations to the planar shape of the substrate 70. It is preferable that the substrate 70 be similar in shape to the first and second semiconductor chips 10 and 20. A substrate with a built-up multilayer structure formed by layering an insulating resin and an interconnect pattern, or a multilayer substrate in which a plurality of substrates are layered may be used as the substrate 70.

Interconnect pattern 72 is formed on the substrate 70. In the present embodiment, the interconnect pattern 72 is formed on one surface of the substrate. The interconnect pattern 72 may be formed on both surfaces of the substrate. In many cases, the interconnect pattern 72 is formed by a plurality of layers. For example, the interconnect pattern 72 may be formed by layering any of copper (Cu), chromium (Cr), titanium (Ti), nickel (Ni), and titanium tungsten (Ti—W). For example, the interconnect pattern 72 may be formed by photolithography. The interconnect pattern 72 may be directly formed on the substrate 70 by sputtering. The interconnect pattern 72 may be formed by plating. Part of the interconnect pattern 72 may be a land (not shown) having an area greater than the area which becomes the wiring. The land has a function of sufficiently securing electrical connection sections. Therefore, the lands may be formed in the connection sections with the electrodes 12 or connection sections with the wires 26.

A plurality of external terminals 80 are electrically connected to the interconnect pattern 72. In FIG. 1, the external terminals 80 are formed on the interconnect pattern 72 through penetrating holes 82 formed in the substrate 70. In this case, the lands may be formed over the penetrating holes 82. In more detail, the external terminals 80 are formed on the lands exposed through the penetrating holes 82, and are projected from a surface of the substrate 70 opposite to the surface on which the interconnect pattern 72 is formed. The external terminals 80 may be formed using solder. The penetrating holes 82 may be filled with solder for forming solder balls, thereby forming a conductive member integrally formed with the solder balls in the penetrating holes 82. The external terminals 80 may be formed using a metal other than solder, a conductive resin, or the like. The external terminals 80 may be formed by bending part of the interconnect pattern 72 in the penetrating holes 82. For example, part of the interconnect pattern 72 may be pushed into the penetrating holes 82 using a metal mold or the like to project from a surface of the substrate 70 opposite to the surface on which the interconnect pattern 72 is formed. The projecting sections may be used as the external terminals.

Instead of positively forming the external terminals 80, the external terminals may be formed when mounting the semiconductor device on a motherboard by solder cream applied to the motherboard due to surface tension during melting. This semiconductor device is a land grid array semiconductor device having lands for forming the external terminals. Part of the interconnect pattern 72 may become the lands. The lands may be formed on a surface of the substrate 70 opposite to the surface on which the interconnect pattern 72 is formed. The lands may be electrically connected to the interconnect pattern 72 through the penetrating holes 82. The penetrating holes 82 may be filled with a conductive material. The surfaces of this conductive material may be used as the lands.

The first semiconductor chip 10 is mounted with the surface on which the electrodes are formed facing the substrate 70 (face down bonding). As the face down bonding technique, a technique using conductive resin paste, a technique using a metal junction such as Au—Au, Au—Sn, or solder, a technique using the shrinkage force of the insulating resin, and the like are given. Although any of these face down bonding techniques may be used, it is indispensable that a first resin be provided between the first semiconductor chip 10 and the substrate 70. In the present invention, in the case where the first resin is not an anisotropic conductive material 74, the space between the first semiconductor chip 10 and the substrate 70 may be filled with the first resin after mounting the first semiconductor chip 10. In the semiconductor device 1, the first resin is the anisotropic conductive material 74. The anisotropic conductive material 74 may be provided so as to extend to the sides of the first semiconductor chip 10 on the substrate 70, although this is not an indispensable condition. Specifically, in the present invention, the first resin may be provided only in the mounting region of the first semiconductor chip 10 on the substrate 70.

According to the present embodiment, the anisotropic conductive material 74 is provided between the first semiconductor chip 10 and the substrate 70 and also provided at the circumference of the first semiconductor chip 10. According to this configuration, since the area of the first semiconductor chip 10 to which the anisotropic conductive material 74 adheres is increased, the first semiconductor chip 10 is firmly secured to the substrate irrespective of the size of the chip. Therefore, it becomes possible to cope with ultrasonic vibration applied when wire bonding the second semiconductor chip 20, for example. As a result, the semiconductor device 1 can be obtained at high yield without being limited by the size of the first and second semiconductor chips 10 and 20.

The anisotropic conductive material 74 is prepared by dispersing conductive particles (fillers) in an adhesive (binder). A dispersing agent may be added to the anisotropic conductive material 74. A heat-curable adhesive is generally used as the adhesive for the anisotropic conductive material 74. As the anisotropic conductive material 74, an anisotropic conductive film previously formed into a sheet is generally used. In addition, a liquid anisotropic conductive material may be used. The anisotropic conductive material 74 is squeezed between the electrodes 12 and the interconnect pattern 72, thereby establishing electrical connection between the electrodes 12 and the interconnect pattern 72 by the conductive particles.

The second semiconductor chip 20 is mounted on the first semiconductor chip 10 with a surface on which the electrodes 22 are formed opposing the first semiconductor chip 10. In other words, the second semiconductor chip 20 is bonded face up to the first semiconductor chip 10. The electrodes 22 and the interconnect pattern 72 are connected by wire bonding. The wires 26 are generally formed using gold, copper, aluminum, or the like. The material for the wires 26 is not limited insofar as the material exhibits conductivity. The second semiconductor chip 20 may be mounted through an adhesive 76. The adhesive 76 is preferably an insulating resin. In FIG. 1, the wires 26 are drawn from the electrodes 22 of the second semiconductor chip 20 and connected to the interconnect pattern 72 located outside the anisotropic conductive material 74 located outside the first semiconductor chip 10 in a plan view of the substrate. In other words, the wires 26 are connected to the interconnect pattern 72 so as to avoid the region of the anisotropic conductive material 74 in a plan view of the substrate 70. There are no specific limitations to the shape of the wires 74. It is preferable that the wires 74 have a shape so as not to come in contact with the end sections of the first and second semiconductor chips 10 and 20. For example, the wire may be formed in the shape of a three-dimensional loop as shown in FIG. 1. Bumps may be formed on the electrodes 22 of the second semiconductor chip 20. The bumps need not be formed, depending on the fabrication process (described later). The mounting section of the first and second semiconductor chips 10 and 20 is sealed with a second resin 90 such as a potted epoxy resin.

FIG. 1 shows a FAN-IN semiconductor device 1 in which the external terminals 80 are formed only in the mounting region of the first semiconductor chip 10. The present invention is not limited to this. For example, the present invention may be applied to a FAN-OUT semiconductor device in which the external terminals 80 are formed only outside the mounting region of the first semiconductor chip 10, or a FAN-IN/OUT semiconductor device including the FAN-OUT semiconductor device and a FAN-IN semiconductor device in combination.

A method of fabricating the semiconductor device according to the present embodiment is described below.

The first semiconductor chip 10 is mounted on the substrate 70 through the anisotropic conductive material 74. In more detail, a surface of the first semiconductor chip 10 on which the electrodes 12 are formed is mounted on the substrate 70 in the region in which the anisotropic conductive material 74 is provided. According to the present embodiment, electrical connection between the electrodes 12 and the interconnect pattern 72 by the anisotropic conductive material 74 and underfilling of the first semiconductor chip 10 and the substrate 70 can be achieved at the same time. Therefore, the semiconductor device can be fabricated using a method excelling in reliability and productivity. In the case where the anisotropic conductive material 74 is heat-curable, the substrate 70 and the first semiconductor chip 10 can be bonded by curing the anisotropic conductive material 74 after mounting the first semiconductor chip 10.

In the present embodiment, the first semiconductor chip is mounted on the substrate 70 after providing the anisotropic conductive material 74 (first resin) on the substrate 70. The present invention is not limited to this. The first resin may be provided between the first semiconductor chip 10 and the substrate 70 after mounting the first semiconductor chip 10 on the substrate 70. The second semiconductor chip 20 may be mounted on the first semiconductor chip 10 in advance, and these semiconductor chips may be mounted on the substrate 70 at the same time. This also applies to other embodiments.

In the case of providing the first resin between the first semiconductor chip 10 and the substrate 70 in advance, the first semiconductor chip 10 and the substrate 70 may be bonded by pressing either the first semiconductor chip 10 or the substrate 70 against the other. At this time, the first resin may be provided in advance so that the anisotropic conductive material 74 is pressed out to the circumference of the first semiconductor chip 10 on the substrate 70. In the case of providing the first resin after mounting the first semiconductor chip 10, the first resin may be provided so as to extend to the circumference of the first semiconductor chip 10. In the case where the first semiconductor chip 10 and the substrate 70 are similar in shape, it is preferable to mount the first semiconductor chip 10 at the center of the substrate 70.

The second semiconductor chip 20 is mounted on the first semiconductor chip 10. In more detail, a surface of the second semiconductor chip 20 opposing the surface on which the electrodes 22 are formed is mounted to face the first semiconductor chip 10. The second semiconductor chip 20 may be bonded to the first semiconductor chip 10 using the adhesive 76. According to the present embodiment, the first semiconductor chip 10 is larger than the second semiconductor chip 20. Therefore, in the case where the first semiconductor chip 10 and the second semiconductor chip 20 can be made similar in shape, it is preferable to mount the second semiconductor chip 20 at the center of the first semiconductor chip 10. The adhesive 76 may be provided so as to extend to the circumference of the second semiconductor chip 20 on the first semiconductor chip 10 by allowing the adhesive 76 to be pressed out from the mounting region of the second semiconductor chip 20. This enables the second semiconductor chip 20 to be bonded to the first semiconductor chip 10 more firmly. The adhesive 76 may be provided to at least either the first semiconductor chip 10 or the second semiconductor chip 20 before mounting the second semiconductor chip 20.

The electrodes 22 of the second semiconductor chip 20 are wire-bonded to the interconnect pattern 72. The electrodes 22 may be bonded using heat and ultrasonic waves, for example. Either the electrodes 22 or the interconnect pattern 72 may be wire bonded first. The step of forming the bumps on the electrodes 22 can be omitted by wire bonding the electrodes 22 first.

According to the present invention, the first resin provided between the first semiconductor chip 10 and the substrate 70 has properties differing from the second resin 90 with which the first and second semiconductor chips 10 and 20 are sealed. This enables the first resin and the second resin 90 to be selected so as to have properties suitable for each member to which the first resin and the second resin 90 adhere. Therefore, it becomes possible to cope with ultrasonic vibration applied when wire bonding the second semiconductor chip 20 by selecting the first resin, for example. Because of this, reliable wire bonding can be performed, whereby the semiconductor device can be fabricated at high yield.

The mounting section of the first and second semiconductor chips 10 and 20 is sealed with the second resin 90. A metal mold may be used for sealing the mounting section, for example. In the case of using a metal mold, the second resin 90 may be a mold resin. The first and second semiconductor chips 10 and 20 can be protected from the external environment by the second resin 90.

A plurality of external terminals 80 may be formed on the interconnect pattern 72. In the case where a plurality of penetrating holes 82 are formed in the substrate 70, the external terminals 80 extend through the penetrating holes 82. In more detail, the external terminals 80 are formed on part of the interconnect pattern 72 exposed through the penetrating holes 82, passed through the penetrating holes 82, so as to be projected from a surface of the substrate 70 in the direction opposite to the interconnect pattern 82.

In the present embodiment, the external terminals 80 are solder balls. The solder balls are formed by a reflow process consisting of providing solder balls and flux, cream solder, or the like and melting the solder by heating. Therefore, the above heating step for the anisotropic conductive material 74 (in the case of heat-curable material) may be omitted. Formation of the solder balls and heating for the anisotropic conductive material 74 may be carried out at the same time in this reflow process.

Second Embodiment

Figure 2:
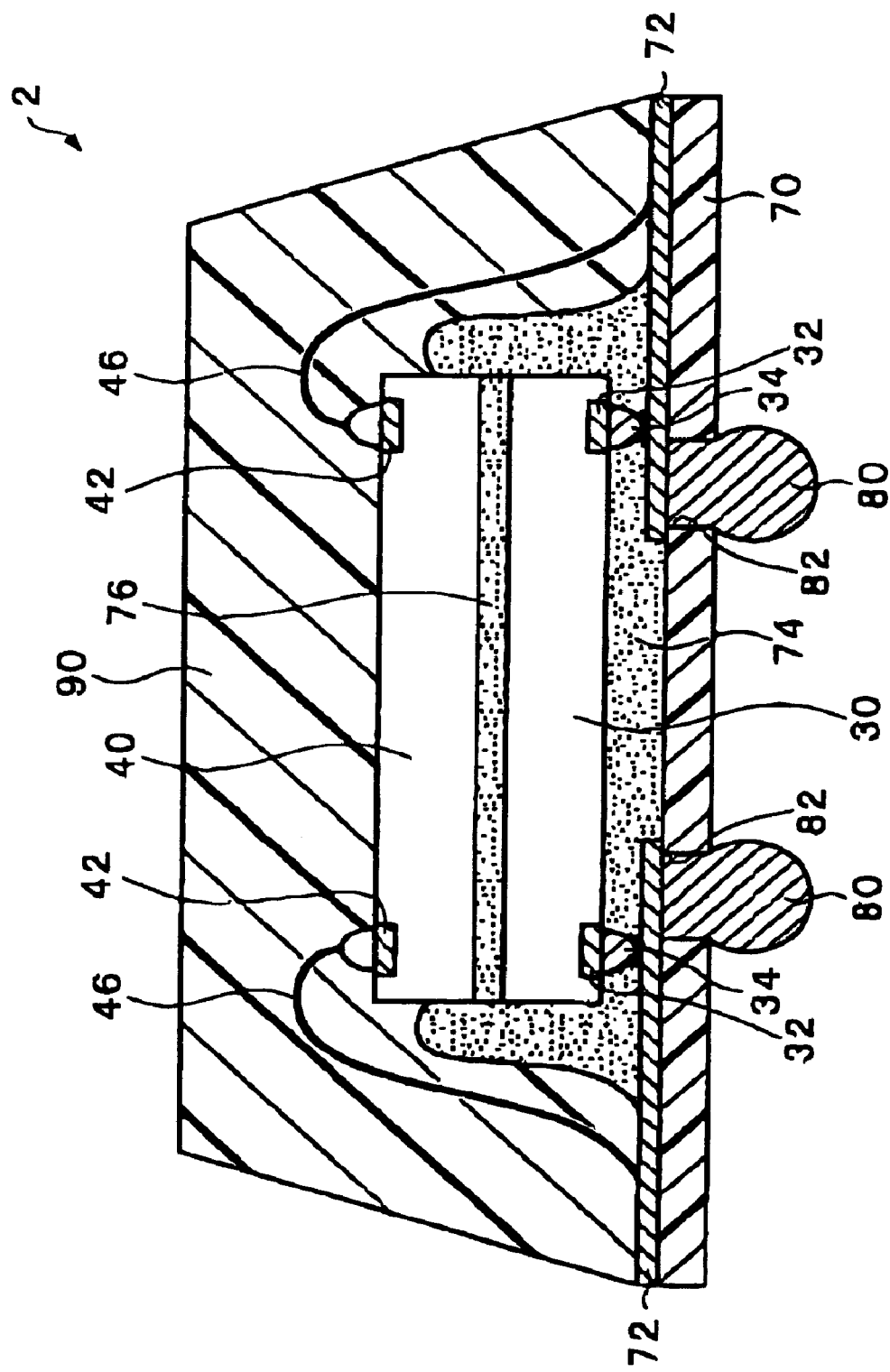
FIG. 2 is a view showing a semiconductor device according to a second embodiment of the present invention.

FIG. 2 is a view showing a semiconductor device according to a second embodiment of the present invention. A semiconductor device 2 includes a first semiconductor chip 30, a second semiconductor chip 40, and the substrate 70.

The first and second semiconductor chips 30 and 40 may be the same as the first and second semiconductor chips 10 and 20 except that the size of the semiconductor chips 30 and 40 is equal. As shown in FIG. 2, the anisotropic conductive material 74 may be provided in the mounting region of the first semiconductor chip 30 on the substrate 70 and outside the mounting region so as to extend to the sides of the first semiconductor chip 30 and the second semiconductor chip 40.

According to the present embodiment, the first resin is provided in the mounting region of the first semiconductor chip 30 on the substrate and extended to the sides of the first semiconductor chip at the circumference thereof. This increases the contact area between the first resin and the first semiconductor chip, whereby the first semiconductor chip can be fixed to the substrate more firmly. Moreover, the first resin may be extended to the sides of the second semiconductor chip. In this case, the second semiconductor chip can also be fixed. Therefore, it becomes possible to cope with ultrasonic vibration applied then wire bonding the second semiconductor chip, for example. Because of this, reliable wire bonding can be performed even it the first and second semiconductor chips 10 and 20 are equal in size, whereby the semiconductor device can be fabricated at high yield.

In the example shown in FIG. 2, the first resin such as the anisotropic conductive material 74 extends to the sides of the upper second semiconductor chip 40. Therefore, in the fabrication process, the first semiconductor chip 30 is connected to the substrate 70 after connecting the first and second semiconductor chips 30 and 40 in many cases. In the case of providing the first resin so as not to exceed the height of the lower first semiconductor chip 30, the first semiconductor chip 30 maybe connected to the substrate 70 first, and the upper second semiconductor chip 40 may be mounted thereon.

Third Embodiment

Figure 3:
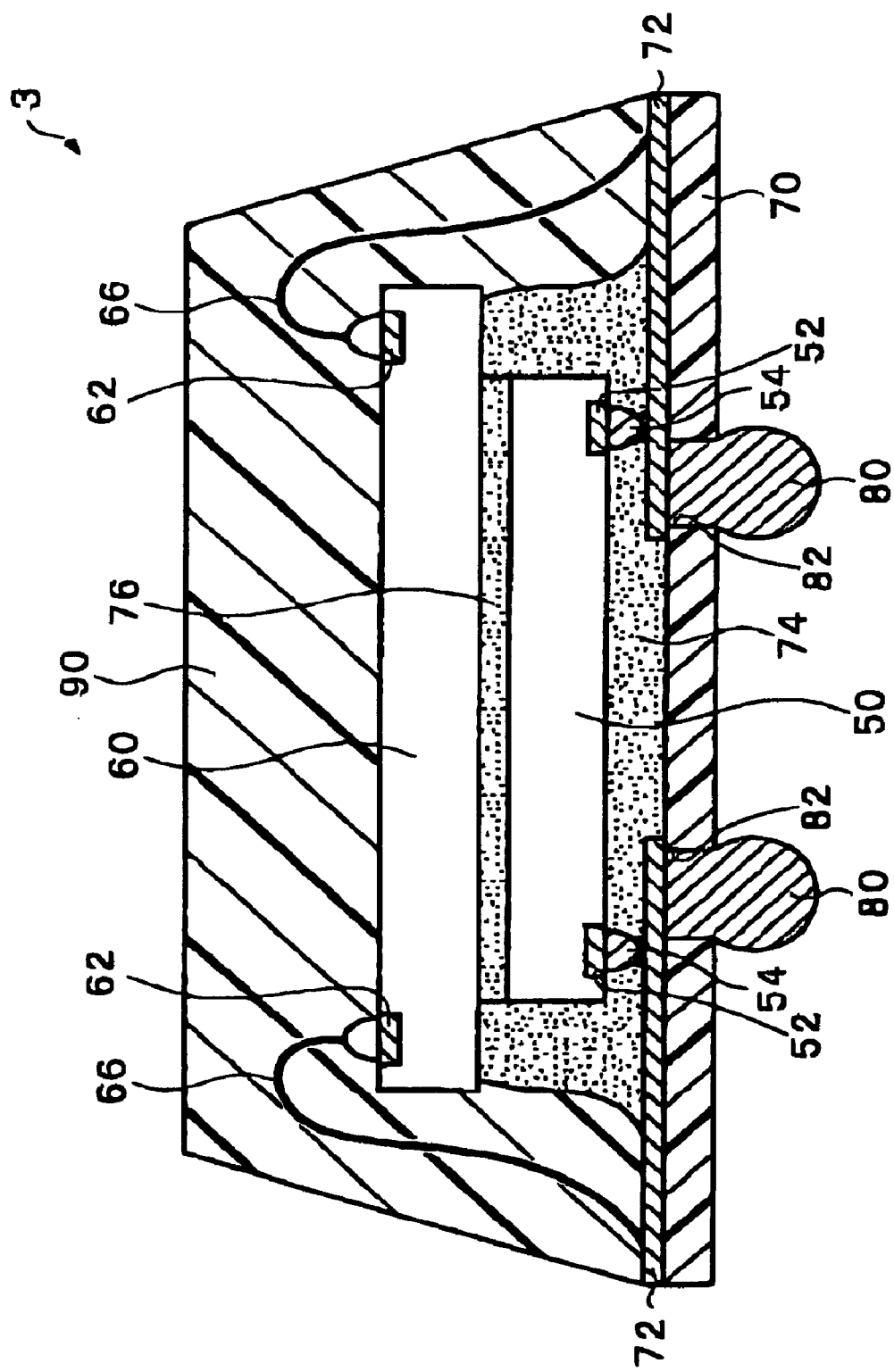
FIG. 3 is a view showing a semiconductor device according to a third embodiment of the present invention.

FIG. 3 is a view showing a semiconductor device according to a third embodiment of the present invention. A semiconductor device 3 includes a first semiconductor chip 50, a second semiconductor chip 60, and the substrate 70.

The first semiconductor chip 50 is smaller than the second semiconductor chip 60. As shown in FIG. 3, the anisotropic conductive material 74 is formed in the mounting region of the first semiconductor chip 30 on the substrate 70 and at the circumference thereof so as to support the second semiconductor chip 60.

According to the present embodiment, the first resin is provided in the mounting region of the first semiconductor chip on the substrate and extended to the sides of the first semiconductor chip at the circumference thereof. This increases the contact area between the first resin and the first semiconductor chip, whereby the first semiconductor chip can be secured to the substrate more firmly. The first resin may further extend to a region of the second semiconductor chip which faces the substrate but avoids facing the first semiconductor chip. In this case, the second semiconductor chip can also be secured. Therefore, it becomes possible to cope with ultrasonic vibration applied when wire bonding the second semiconductor chip, for example. Because of this, reliable wire bonding can be performed even if the first semiconductor chip is smaller than the second semiconductor chip, whereby a semiconductor device can be fabricated at high yield.

According to the present embodiment, the second semiconductor chip 60 can be supported by a small amount of the anisotropic conductive material 74 in the case where the first semiconductor chip is thin (about 50 $\mu$m). Therefore, the second semiconductor chip 60 can be effectively secured without uselessly increasing the region covered by the anisotropic conductive material 74.

There are no specific limitations to the adhesive 76 insofar as the adhesive 76 has a function of bonding the semiconductor chips. In the case where the size of the upper second semiconductor chip 60 is larger than that of the lower first semiconductor chip 50, use of a film-shaped solid adhesive leads to an advantage inasmuch as the management of the fabrication becomes easy in comparison with the use of a paste adhesive.

Figure 4:
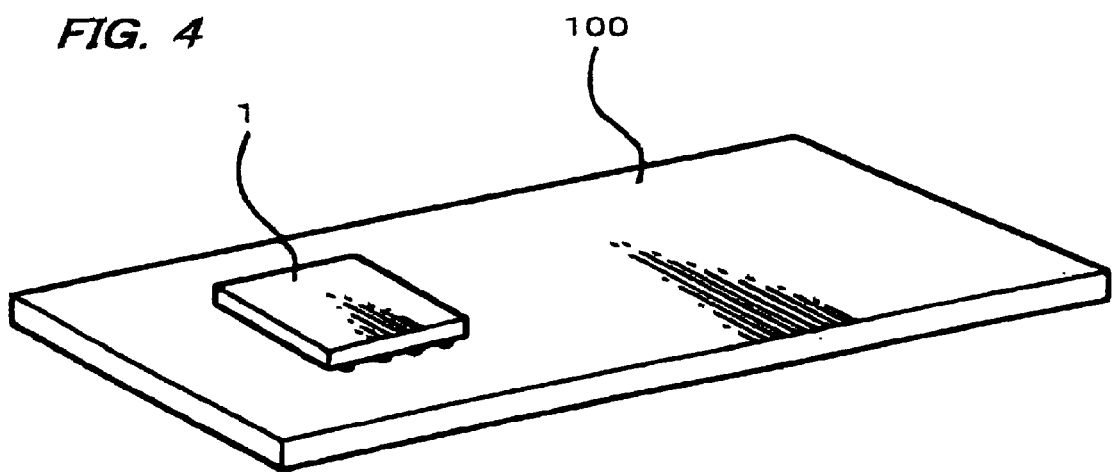
FIG. 4 is a circuit board to which the present invention is applied.

FIG. 4 is a view showing a circuit board 100 on which the semiconductor device 1 according to the present embodiment is mounted. An organic substrate such as a glass epoxy substrate is generally used as the circuit board 100. Interconnect patterns are formed on the circuit board 100 using copper, for example, so as to form a desired circuit. Electrical connection between the interconnect patterns and the semiconductor device 1 is established by connecting the interconnect patterns to the external terminals 80 of the semiconductor device 1.

Figure 5:
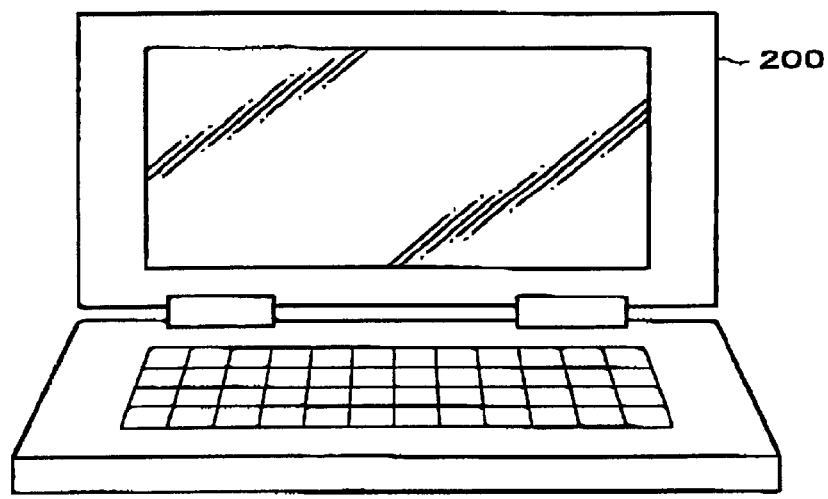
FIG. 5 is a view showing electronic equipment including the semiconductor device according to the present invention.
Figure 6:
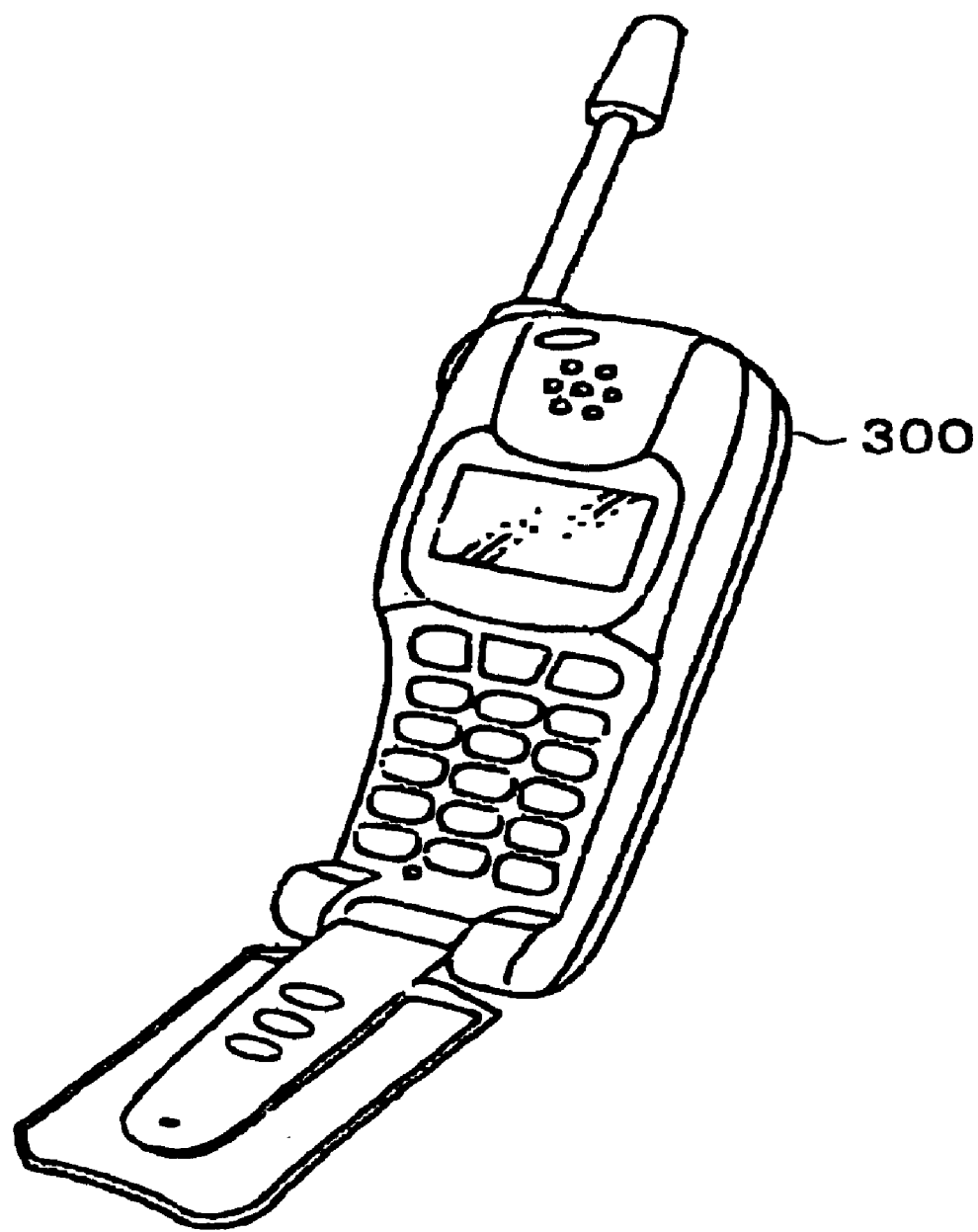
FIG. 6 is a view showing electronic equipment including the semiconductor device according to the present invention.

FIGS. 5 and 6 respectively show a notebook-type personal computer and a portable telephone as examples of electronic equipment including the semiconductor device 1 to which the present invention is applied.

What is claimed is:

1. A semiconductor device comprising:
   a first semiconductor chip which has a surface having a plurality of electrodes and is mounted on a substrate having an interconnect pattern, wherein the surface having the electrodes faces the substrate and the electrodes are electrically connected to the interconnect pattern;
   a second semiconductor chip which has a surface having a plurality of electrodes and is mounted on the first semiconductor chip, wherein the surface of the second semiconductor chip having the electrodes opposes the first semiconductor chip and the electrodes of the second semiconductor chip are electrically connected to the interconnect pattern through wires;
   a first resin provided between the substrate and the first semiconductor chip; and
   a second resin which differs from the first resin and seals the first and second semiconductor chips to the substrate,
   wherein the first resin is provided so as to extend to the sides of both the first semiconductor chip and the second semiconductor chip.

2. The semiconductor device as defined in claim 1, wherein:
   the first resin is an anisotropic conductive material containing conductive particles; and
   the electrodes of the first semiconductor chip are electrically connected to the interconnect pattern through the conductive particles.

3. The semiconductor device as defined in claim 1, wherein:
   a plurality of penetrating holes are formed in the substrate;
   the interconnect pattern is formed on one surface of the substrate, part of the interconnect pattern extending over the penetrating holes; and
   a plurality of external terminals are formed on the interconnect pattern to project from a surface of the substrate opposite to the surface on which the interconnect pattern is formed through the penetrating holes.

4. The semiconductor device as defined in claim 1, further comprising:
a plurality of lands for external terminals which are electrically connected to the interconnect pattern.

5. The semiconductor device as defined in claim 1, wherein the substrate is a glass epoxy substrate.

6. The semiconductor device as defined in claim 1, wherein the second semiconductor chip is bonded to the first semiconductor chip through an adhesive.

7. The semiconductor device as defined in claim 1, wherein the first semiconductor chip is larger than the second semiconductor chip.

8. The semiconductor device as defined in claim 1, wherein the first and second semiconductor chips are equal in size.

9. The semiconductor device as defined in claim 1, wherein the first semiconductor chip is smaller than the second semiconductor chip.

10. The semiconductor device as defined in claim 9, wherein the first resin is provided so as to extend to the sides of the first semiconductor chip and to a region of the second semiconductor chip which faces the substrate but avoids facing the first semiconductor chip.

11. A circuit board equipped with the semiconductor device as defined in claim 1.

12. Electronic equipment comprising the semiconductor device as defined in claim 1.

13. A semiconductor device comprising:
a first semiconductor chip which has a surface having a plurality of electrodes and is mounted on a substrate having an interconnect pattern, wherein the surface having the electrodes faces the substrate and the electrodes are electrically connected to the interconnect pattern;
a second semiconductor chip which has a surface having a plurality of electrodes and is mounted on the first semiconductor chip, wherein the surface of the second semiconductor chip having the electrodes opposes the first semiconductor chip and the electrodes of the second semiconductor chip are electrically connected to the interconnect pattern through wires;
a first resin provided between the substrate and the first semiconductor chip; and
a second resin which differs from the first resin and seals the first and second semiconductor chips to the substrate,
wherein the first semiconductor chip is larger than the second semiconductor chip such that the first semiconductor chip has a protruding upper surface that protrudes beyond the second semiconductor chip, and the protruding upper surface is entirely covered with the second resin.

14. The semiconductor device as defined in claim 13, wherein the first resin is provided so as to extend to the sides of the first semiconductor chip.

15. A semiconductor device comprising:
a first semiconductor chip which has a surface having a plurality of electrodes and is mounted on a substrate having an interconnect pattern, wherein the surface having the electrodes faces the substrate and the electrodes are electrically connected to the interconnect pattern;
a second semiconductor chip which has a surface having a plurality of electrodes and is mounted on the first semiconductor chip, wherein the surface of the second semiconductor chip having the electrodes opposes the first semiconductor chip and the electrodes of the second semiconductor chip are electrically connected to the interconnect pattern through wires;
a first resin provided between the substrate and the first semiconductor chip; and
a second resin which differs from the first resin and seals the first and second semiconductor chips to the substrate,
wherein the first semiconductor chip is smaller than the second semiconductor chip such that the second semiconductor chip has a protruding bottom surface that protrudes beyond the first semiconductor chip and an opposing bottom surface that opposes the first semiconductor chip, and the first resin is provided so as to touch the protruding bottom surface and avoid the opposing bottom surface.

16. The semiconductor device as defined in claim 15, wherein the second semiconductor chip is bonded to the first semiconductor chip through an adhesive which differs from the first resin.

17. A method of fabricating a semiconductor device comprising the steps of:
face-down bonding a first semiconductor chip to a substrate on which an interconnect pattern is formed;
mounting a second semiconductor chip on the first semiconductor chip;
electrically connecting the second semiconductor chip to the interconnect pattern through wires;
providing a first resin between the first semiconductor chip and the substrate; and
sealing the first and second semiconductor chips with a second resin which differs from the first resin;
wherein the first resin is provided so as to extend to the sides of both the first semiconductor chip and the second semiconductor chip.

18. The method of fabricating a semiconductor device as defined in claim 17, wherein:
the first resin is an anisotropic conductive material containing conductive particles; and
electrodes of the first semiconductor chip are electrically connected to the interconnect pattern through the conductive particles.

19. The method of fabricating a semiconductor device as defined in claim 17,
wherein the second semiconductor chip is bonded to the first semiconductor chip through an adhesive in the step of mounting the second semiconductor chip.

20. The method of fabricating a semiconductor device as defined in claim 17, wherein:
the first semiconductor chip is larger than the second semiconductor chip; and
after the step of bonding the first semiconductor chip and the step of providing the first resin, at lease one of the first semiconductor chip and the substrate is pressed against the other to extend the first resin to the sides of the first semiconductor chip.

21. The method of fabricating a semiconductor device as defined in claim 17, wherein:
the first and second semiconductor chips are equal in size; and
after the step of bonding the first semiconductor chip and the step of providing the first resin, at least one of the first semiconductor chip and the substrate is pressed against the other to extend the first resin to at least the sides of the first semiconductor chip among the sides of the first and second semiconductor chips.

22. The method of fabricating a semiconductor device as defined in claim 17, wherein:

the first semiconductor chip is smaller than the second semiconductor chip; and after the step of bonding the first semiconductor chip and the step of providing the first resin, at least one of the first semiconductor chip and the substrate is pressed against the other to extend the first resin to the sides of the first semiconductor chip and to a region of the second semiconductor chip which faces the substrate but avoids facing the first semiconductor chip.

23. The method of fabricating a semiconductor device as defined in claim 17, wherein:

the wires are bonded by ultrasonic waves in the step of connecting through the wires.

24. The method of fabricating a semiconductor device as defined in claim 23, wherein:

after bonding electrodes of the second semiconductor chip to the wires, the wires are bonded to the interconnect pattern, in the step of connecting through the wires.

* * * * *